(12) United States Patent
Ban et al.

(10) Patent No.: US 9,082,922 B2
(45) Date of Patent: Jul. 14, 2015

(54) ORGANIC/INORGANIC HYBRID OPTICAL AMPLIFIER WITH WAVELENGTH CONVERSION

(76) Inventors: Dayan Ban, Waterloo (CA); Zhenghong Lu, Toronto (CA); Jun Chen, Waterloo (CA)

( * ) Notice: Subject to any disclaimer, the term of this patent is extended or adjusted under 35 U.S.C. 154(b) by 84 days.

(21) Appl. No.: 13/817,284

(22) PCT Filed: Aug. 16, 2011

(86) PCT No.: PCT/CA2011/000924
§ 371 (c)(1),
(2), (4) Date: Apr. 24, 2013

(87) PCT Pub. No.: WO2012/021968
PCT Pub. Date: Feb. 23, 2012

(65) Prior Publication Data
US 2013/0215496 A1    Aug. 22, 2013

Related U.S. Application Data

(60) Provisional application No. 61/344,549, filed on Aug. 18, 2010.

(51) Int. Cl.
*H01L 31/14* (2006.01)
*H01L 27/32* (2006.01)
(Continued)

(52) U.S. Cl.
CPC ............... *H01L 31/14* (2013.01); *G02F 1/015* (2013.01); *H01L 27/3227* (2013.01);
(Continued)

(58) Field of Classification Search
CPC ....................................................... H01L 31/14
See application file for complete search history.

(56) References Cited

U.S. PATENT DOCUMENTS 4,002,902 A * 1/1977 Donjon et al. .......... 250/214 LA 4,614,958 A * 9/1986 Mikami et al. ................ 257/85
(Continued)

FOREIGN PATENT DOCUMENTS

WO    2009/117613 A1    9/2009

OTHER PUBLICATIONS

Chen et al, (Oct. 1, 2009); Near-IR Optical Upconverter with Integrated Heterojunction Phototransistor and Organic Light-Emitting Diode, IEEE Photonics Technology Letters, vol. 21 (19): pp. 1447-1449.

*Primary Examiner* — Ari M Diacou

(57) ABSTRACT

A device and related fabrication method is provided for an organic/inorganic hybrid optical amplifier with a function of converting infrared light to visible light. The hybrid device integrates an inorganic heterojunction phototransistor (HPT), an embedded metal electrode mirror with a dual function as an optical mirror and charge injection electrode, and an organic light emitting diode (OLED). This integrated optical amplifier is capable of amplifying the incoming light and producing light emission with a power greater than that of the incoming signal. In the second aspect of the invention, the optical amplifier is capable of detecting an incoming infrared electromagnetic wave and converting the wave back to a visible light wave. The optical device has dual functions of optical power amplification and photon energy up-conversion. The optical amplifier device consists of an InGaAs/InP based HPT structure as photodetector, gold-coated metals as embedded mirror and a top-emission OLED. New optical up-conversion imaging devices are also provided that include focal-point array of the organic/inorganic hybrid optical amplifier devices in pixelated formats. The up-conversion imaging devices have a fast response time to enable gated operation for practical applications such as night vision, active surveillance, semiconductor wafer inspection and eye-safe infrared imaging. More importantly, the up-conversion imaging devices would be particularly useful for detecting ultra-low intensity infrared scenes.

20 Claims, 9 Drawing Sheets

(51) Int. Cl.
*H01L 31/153* (2006.01)
*G02F 1/015* (2006.01)

(52) U.S. Cl.
CPC ....... *H01L 31/153* (2013.01); *G02F 2202/101* (2013.01); *G02F 2202/102* (2013.01); *G02F 2202/12* (2013.01); *G02F 2203/11* (2013.01); *H01L 2251/5315* (2013.01)

(56) References Cited

U.S. PATENT DOCUMENTS

| | | | |
|---|---|---|---|
| 4,755,674 A * | 7/1988 | Schaaf | 250/338.1 |
| 5,294,992 A * | 3/1994 | Konno et al. | 348/767 |
| 5,389,788 A * | 2/1995 | Grinberg et al. | 250/331 |
| RE34,947 E * | 5/1995 | Takanashi et al. | 250/214 LA |
| 5,438,198 A * | 8/1995 | Ebitani et al. | 250/330 |
| 6,160,828 A * | 12/2000 | Kozlov et al. | 372/39 |
| 6,410,201 B2 * | 6/2002 | Wolk et al. | 430/200 |
| 7,079,307 B2 * | 7/2006 | Chun Liu et al. | 359/326 |
| 7,247,850 B2 * | 7/2007 | Laou et al. | 250/332 |
| 7,326,908 B2 * | 2/2008 | Sargent et al. | 250/214.1 |
| 7,381,953 B1 * | 6/2008 | Kaufman | 250/332 |
| 7,604,523 B1 * | 10/2009 | Wedding et al. | 445/23 |
| 7,622,866 B1 * | 11/2009 | Wedding et al. | 313/582 |
| 7,728,274 B2 * | 6/2010 | Pilla et al. | 250/214 LA |
| 7,833,076 B1 * | 11/2010 | Strbik et al. | 445/24 |
| 7,872,233 B2 * | 1/2011 | Hu et al. | 250/338.1 |
| 8,405,028 B2 * | 3/2013 | So | 250/330 |
| 8,796,699 B2 * | 8/2014 | So et al. | 257/82 |
| 2002/0009274 A1 * | 1/2002 | Gharavi | 385/122 |
| 2002/0130248 A1 * | 9/2002 | Bretschneider et al. | 250/214 R |
| 2004/0031965 A1 * | 2/2004 | Forrest et al. | 257/79 |
| 2004/0031966 A1 * | 2/2004 | Forrest et al. | 257/79 |
| 2005/0083567 A1 * | 4/2005 | Chun Liu et al. | 359/326 |
| 2005/0236556 A1 * | 10/2005 | Sargent et al. | 250/214.1 |
| 2006/0097247 A1 * | 5/2006 | Kim et al. | 257/40 |
| 2007/0029482 A1 * | 2/2007 | Laou et al. | 250/332 |
| 2010/0133504 A1 * | 6/2010 | Wang et al. | 257/13 |
| 2010/0181552 A1 * | 7/2010 | So | 257/21 |
| 2012/0188633 A1 * | 7/2012 | Akselrod et al. | 359/346 |

* cited by examiner

ORGANIC/INORGANIC HYBRID OPTICAL AMPLIFIER WITH WAVELENGTH CONVERSION

FIELD OF THE INVENTION

The invention relates generally to the field of optical amplifiers. This invention further relates to devices that incorporate infrared imaging.

BACKGROUND OF THE INVENTION

Infrared imaging is widely used in a variety of applications including night vision, surveillance, search and rescue, remote sensing, and preventive maintenance. Imaging devices to provide these applications are typically constructed of HgCdTe or InSb focal plane arrays. For example, quantum well infrared photodetectors (QWIPs) can detect mid- and far-infrared light, and are operable to generate an output current from the light source. Such arrays are generally complicated to manufacture and costly.

Infrared thermal imaging, which incorporates GaAs QWIPs and GaAs light emitting diodes (LEDs) via monolithic epitaxial growth integration, was disclosed by one of the applicants, H. C. Liu, in U.S. Pat. No. 5,567,955 issued Oct. 22, 1996 to the National Research Council of Canada, and in U.S. Pat. No. 6,028,323 issued Feb. 22, 2000 to the National Research Council of Canada. The former patent describes the vertical integration of a light emitting diode with a QWIP. Current from the QWIP device resulting from the impingement of far-infrared (FIR) drives the LED to emit near-infrared (NIR) photons. The NIR photons can be efficiently detected by a silicon charge coupled device (CCD), leading to a highly efficient detector. U.S. Pat. No. 6,028,323 described devices that can be used as a pixelless means of up-converting and imaging a FIR beam to a NIR beam, presented the device and system configurations that allows the input FIR energy and output NIR energy through the same side of the device. In both aforementioned patents, the vertical device integration relies on subsequent epitaxial growth of the LED layers over the QWIP layers on a same substrate.

H. C. Liu, D. Ban and H. Luo, in U.S. Pat. No. 7,079,307 issued Jul. 18, 2006 to the National Research Council of Canada describes a wavelength conversion device wherein a photodetector (PD), an avalanche multiplier (Amplifier), and an inorganic light emitting diode (LED) are integrated vertically either via subsequent epitaxial growth of the different functioning layers on a same wafer or via wafer fusion of the functioning layers which are grown on different wafers. The wavelength up-conversion from a range of 1.1-1.65 µm to below 1.0 µm (e.g., 872 nm or 923 nm) results in highly-efficient detection by a silicon charge coupled device (CCD) camera. Wafer fusion technology was employed to integrate different functioning units in a single device, which released the stringent lattice matching requirement for epitaxial growth of inorganic semiconductor materials.

Wafer fusion is an advanced processing technology that allows integrating heterogeneous semiconductor materials regardless of their lattice constant. Wafer fusion can be simply described as a direct bonding in which chemical bonds are established between two wafers/materials at their hetero-interface in the absence of an intermediate layer. It removes the limitations associated with the use of lattice-matched materials and gives a new degree of freedom for the design of novel semiconductor optoelectronic devices.

Methods for making pixelized and pixel-less QWIP-LED imaging devices are described in U.S. Pat. No. 5,567,955 and U.S. Pat. No. 6,028,323, respectively. These methods can be used for making pixelized and pixel-less up-conversion imaging devices as well. Micro-fabrication of such devices may involve mesa etching for device isolation and metal depositions for electrical contacts. Additional steps such as depositions of anti-reflection coatings and fabrication of micro-lens on device top surface may be taken for improving device performance.

The above methods and resulting devices are generally relatively complicated and costly to manufacture. There is a need for a device and method for fabrication of a device that provides an optical amplifier with desirable performance characteristics.

SUMMARY OF THE INVENTION

In a first aspect of the invention, a hybrid organic/inorganic optical amplifier device is provided comprising:
(a) a base layer coated with a contacting electrode connected to a circuit;
(b) a photoconductive element, configured to provide built-in gain; and
(c) an optical reflector on the photoconductive element, connected to an organic electroluminescent element,
wherein the photoconductive element, the optical reflector, and the electroluminescent element are made and integrated so that (A) upon application of the photoconductive element, or exposure of the photoconductive element to, electromagnetic radiation, the photoconductive element generates carrier charges, and (B) based on application of a charge current to the base layer, a carrier injection is produced from the photoconductive element to the electroluminescent element, thereby converting light in an infrared wavelength region to light in a visible-light range.

In a further aspect of the device of the invention, the photoconductive element is either a hetero-injunction phototransistor element or a photoconductive detector.

In another aspect of the invention, the photoconductive element is an organic heterojunction phototransistor (HPT). In another aspect of the invention, the HPT consists of an InGaAs/InP based HPT structure.

In another aspect of the invention, the optical reflector is an embedded metal electrode mirror that is made to function both as an optical mirror and as a charge injection electrode.

In a still further aspect of the invention, the electroluminescent element is an organic light emitting diode (OLED).

The device is capable of amplifying incoming light and producing a light emission with a power greater than that of the incoming signal. In another aspect, the device is further operable to detect an incoming infrared electromagnetic wave and to convert the wave to a visible light wave. The device is made to achieve dual functions of optical power amplification and photon energy up-conversion.

In another aspect of the invention, the device is made and integrated to both amplify the incoming optical power and convert the incoming optical signal from infrared to visible light.

In another aspect of the invention, the HPT includes a p-n-p comprising $In_{0.53}Ga_{0.47}As$/InP HPT, which can absorb infrared light with a wavelength up to 1.65 µm and can amplify the photocurrent by two orders of magnitude or more. In a still other aspect of the invention, the HPT consists of a p-doped collector, a n-doped base and a p-doped emitter. In another aspect of the invention, the p-doped emitter has a bi-layer structure with a high-low doping profile in order to reduce the dark current of the device and enhance device performance.

In a still other aspect of the invention, the embedded metal electrode mirror is a conductive layer capable of functioning as a hole injection electrode for the organic electroluminescent element.

In a still further aspect of the invention, the organic electroluminescent element consists of a stack of hole transport molecules, electroluminescent molecules, and electron transport molecules.

In yet another aspect of the invention, the organic electroluminescent element has a hole transport layer (HTL), a configuration consisting of one layer of NPB (N,N'-di(naphthalene-1-yl)-N,N'-diphenyl-benzidine), one layer of CuPc (Copperphthalocyanine) and one layer of C60 (carbon fullerene).

In another aspect of the invention, an imaging device is provided that includes an array of optical amplifiers, wherein each optical amplifier defines an organic/inorganic optical amplifier area, each optical amplifier including: a base layer coated with a contacting electrode connected to a circuit; a photoconductive element, configured to provide built-in gain; and an optical reflector on the photoconductive element, connected to an organic electroluminescent element, wherein the photoconductive element, the optical mirror, and the electroluminescent element are made and integrated so that (A) upon application of the photoconductive element, or exposure of the photoconductive element to, electromagnetic radiation, the photoconductive element generates a carrier charge, and (B) based on application of a charge current to the base layer, a carrier injection is produced from the photoconductive element to the electroluminescent element, thereby converting light in an infrared wavelength region to light in a visible range.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

BRIEF DESCRIPTION OF THE DRAWINGS

The invention will be better understood and objects of the invention will become apparent when consideration is given to the following detailed description thereof. Such description makes reference to the annexed drawings wherein.

Figure 1:
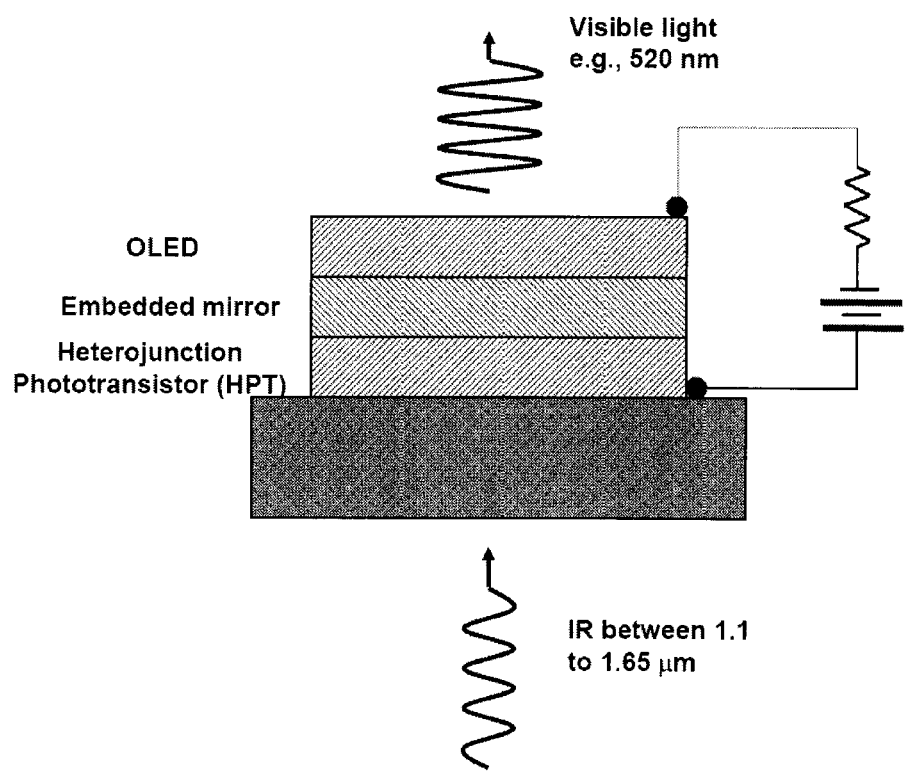
FIG. 1 is a representative cross-section of an organic/inorganic optical amplifier with wavelength conversion, in accordance with the present invention.

In the drawings, embodiments of the invention are illustrated by way of example. It is to be expressly understood that the description and drawings are only for the purpose of illustration and as an aid to understanding, and are not intended as a definition of the limits of the invention.

DETAILED DESCRIPTION OF THE PREFERRED EMBODIMENT

A device and related fabrication method is provided for a unique and innovative organic/inorganic hybrid optical amplifier that is made and integrated to convert infrared light to visible light.

A hybrid organic/inorganic optical amplifier device is provided comprising: a base layer coated with a contacting electrode connected to a circuit; a photoconductive element, configured to provide built-in gain; and an optical reflector on the photoconductive element, connected to an organic electroluminescent element, wherein the photoconductive element, the optical reflector, and the electroluminescent element are made and integrated so that (A) upon application of the photoconductive element, or exposure of the photoconductive element to, electromagnetic radiation, the photoconductive element generates carrier charges, and (B) based on application of a charge current to the base layer, a carrier injection is produced from the photoconductive element to the electroluminescent element, thereby converting light in an infrared wavelength region to light in a visible range.

The hybrid device integrates (in one implementation) an inorganic heterojunction phototransistor (HPT), an embedded metal electrode mirror with a dual function as an optical mirror and charge injection electrode, and an organic light emitting diode (OLED).

This integrated optical amplifier is capable of amplifying the incoming light and producing light emission with a power greater than that of the incoming signal. In the second aspect of the invention, the optical amplifier is capable of detecting an incoming infrared electromagnetic wave and converting the wave back to a visible light wave. The optical device has dual functions of optical power amplification and photon energy up-conversion. The optical amplifier device consists of an InGaAs/InP based HPT structure as photodetector, gold-coated metals as embedded mirror and a top-emission OLED. New optical up-conversion imaging devices are also provided that include focal-point array of the organic/inorganic hybrid optical amplifier devices in pixelated formats. The up-conversion imaging devices have a fast response time to enable gated operation for practical applications such as night vision, active surveillance, semiconductor wafer inspection and eye-safe infrared imaging. More importantly, the up-conversion imaging devices would be particularly useful for detecting ultra-low intensity infrared scenes.

As best illustrated in FIG. 1, which shows the basic vertical structure of the present invention, in one particular implementation of the invention, the optical amplifier device may be implemented using a heterojunction phototransistor (HPT) (10), a reflector embedded to the HPT (12), and an organic light emitting diode (OLED) (14), wherein the HPT and OLED are integrated for example via direct tandem integration. The elements or layers are integrated vertically on a base layer or substrate (16).

Under normal operation conditions, the HPT portion of the device detects an incoming infrared signal and generates a photocurrent. The resulting photocurrent is subsequently amplified by approximately two orders of magnitude (for example based on the design parameters described below) and injected into the OLED portion to emit visible light.

The hybrid organic/inorganic optical amplifier device of the design of the present invention enables two functions: (1) amplifying optical light, and (2) converting the photocurrent wavelength from the infrared wavelength region to the visible light region.

One example of the HPT portion of the device of the present invention may be implemented using $In_{0.53}Ga_{0.47}As/InP$ p-n-p structures, which may be grown for example using metal organic chemical vapor deposition (MOCVD) on an InP substrate. A suitable OLED structure can be grown for example in a cluster tool. The two components or portion, i.e. the HPT portion and OLED portion, are joined together by means of a reflector, which may be an embedded mirror. Conveniently, the embedded mirror may serve as the top electrode of the photodetector and the bottom electrode of the OLED. The embedded mirror connection of the present invention is operable to provided efficient carrier injection from the HPT to the OLED, which is one of the aspects of the invention that provides the desirable performance parameters of the device. More particularly, the OLED with the embedded mirror provides a charge injection electrode, and the counter electrode is provided by means of the contacting electrode, by means of a charge current provided through the external driving circuit.

Current from the HPT component resulting from the impingement of infrared radiation in the wavelength range of 0.9 to 1.65 µm is injected through the embedded mirror into the OLED, and drives the OLED to emit photons in visible light wavelength range, e.g., at 520 nm. The output visible light may be collected from a top surface of the device, to enable a number of devices incorporating the optical device of the present invention, or an imaging array based on the optical amplifier device stack structure described in this disclosure. For example, the output energy can be efficiently detected by a silicon CCD camera or visible to naked human eyes.

The integrated device of the present invention therefore is operable to provide in a single device both a solid-state optical amplifier and a solid-state optical wavelength converter.

Examples of Implementation of the Invention

In another aspect of the invention, the integration of the components or portions as described may be provided by means of direct tandem integration of an MOCVD-grown $In_{0.53}Ga_{0.47}As/InP$ p-n-p HPT layers, a thin Au layer, and organic light emitting diode layers on a single InP substrate.

It should be understood that the operation of an $In_{0.53}Ga_{0.47}As/InP$ based HPT is similar to that of a typical bipolar junction transistor, and is well known in the art, for example Chapter 7 of "Solid State Electronic Devices", 6$^{th}$ edition, by Streetman and Banerjee. The InGaAs based HPT generally responds to visible and infrared light over a wavelength range from 0.9 to 1.65 µm. A representative HPT structure suitable for use in the structure of the present invention may consist of a p-doped InGaAs collector layer, a n-doped InGaAs base layer, and a p-doped InP emitter layer. This p-n-p structure is biased with a forward-biased emitter junction and a reverse-biased collector junction and a floating base.

It should be understood that organic devices, both electronic and optoelectronic, have the advantage of ease or processing in part because of the flexibility of deposition of organic films on various substrates. Significant progress has been made in realizing different functions by using organic materials for low-cost devices, such as organic field-effect transistors, organic light-emitting diodes (OLEDs), organic displays and organic photovoltaic cells for example. In this regard, consider Dodabalapur et al. in *Appl. Phys. Lett.*, vol. 68, p. 1108, 1996; Han et al. in *J. Appl. Phys.*, vol. 97, p. 093102, 2005; and Müller, et al., in *Nature*, vol. 421, p. 829, 2003.

However, use of organic components or devices in conjunction with inorganic components or devices so as to provide for example optical amplifier devices based in part on organically formed components or regions, has been limited by the absence of designs or manufacturing processes that would enable the integration of these components, devices, or layers. The present invention provides a set of innovative solutions to this problem.

An OLED device generally consists of a simple stack consisting of an anode, a hole transport layer (HTL), a light-emitting layer, an electron transport layer (ETL), and a cathode layer, and typically emits visible light. As each organic molecule is a topologically perfect structure, the growth of each organic layer does not require "lattice matching", and therefore is not subject to a limitation on the growth of inorganic semiconductor monolithic devices. Moreover, OLED emission wavelengths can be easily varied across the complete visible spectrum. Thus, integration of an OLED with a III-V compound semiconductor, for example, is a highly feasible and desirable approach for making low-cost, large-area, potentially high-efficiency devices by exploiting the tremendous progress in OLEDs.

In accordance with another embodiment, the p-doped collector of the HPT component consists of two p-doped $In_{0.53}Ga_{0.47}As$ layers. One layer is doped at $5 \times 10^{17}$ cm$^{-3}$ with a thickness of 1 µm and the other layer is doped at $1 \times 10^{18}$ cm$^{-3}$ with a thickness of 0.5 µm.

In accordance with yet another embodiment, the n-doped base and p-doped emitter layers of the HPT component are engineered so that they achieve in a collective manner a built-in gain of 100 or more. One example of an HPT structure that provides this built-in gain is a structure consisting of a 50 nm thick n-doped InGaAs base layer with a doping concentration of $8\times10^{17}$ cm$^{-3}$ and a p-doped bi-layer emitter.

In accordance with another aspect of the invention, the bi-layer emitter of the HPT component may be designed so as to provide a high-low doping profile in order to reduce the dark current of the device and enhance device performance. One example of such a bi-layer emitter structure consists of a 0.5 μm thick p-InP layer doped at $1\times10^{18}$ cm$^{-3}$ and a 0.1 μm thick p-InP layer doped at $5\times10^{16}$ cm$^{-3}$.

In accordance with another example of implementation of the invention, the integrated OLED may have a hole transport layer (HTL) configuration that consists of one single layer of NPB (N,N'-di(naphthalene-1-yl)-N,N'-diphenyl-benzidine), one layer of CuPc (Copper phthalocyanine), and one layer of C60 (carbon fullerene).

In accordance with another detail of possible implementation of the invention, the surface of the inorganic photo-detector is treated using (NH$_4$)$_2$S water solution before depositing OLED layers. This surface treatment facilitates carrier injection from the inorganic layer to the organic layer.

In accordance with another aspect of possible implementation of the invention, the embedded mirror may consist of a thin Ti layer, a thin Pt and a thin Au layer fabricated on the top surface of the inorganic photo-detector in order to lower device turn-on voltage and enhance device performance.

In accordance with another embodiment, the integrated HPT, the embedded mirror and the OLED may be divided into a two dimensional arrays, and these arrays may be connected in parallel, to achieve a pixelated imaging array that also provides optical amplification.

In accordance with another possible implementation of the present invention, further mechanisms may be used for improving performance and extending device functionality such as for example incorporating into the photo-detector component or layer materials that are sensitive to x-ray photons.

Hybrid Organic/Inorganic Optical Amplifier Device in Operation

The substrate (14) is transparent to the incoming IR energy (in wavelength range of 1.1 to 1.65 μm), so that (A) IR energy passes through the substrate to the HPT, i.e. the photon detecting portion of the invention. (B) Upon application of a bias current, e.g. from a battery via a load resistor, to the stacked HPT, embedded mirror and OLED in series, the same current passes through all of them. (C) The incoming IR energy generates photocurrent in the HPT component, which is substantially amplified and injected into the OLED through the electric connection via the embedded mirror. (D) The increase of bias current due to the generation of the photo-current leads to the increase of OLED emission at visible light wavelengths (e.g., λ=564 nm), which can be detected for example by a detector or a Si CCD camera or naked human eyes.

Due to the built-in gain of the HPT part, the photocurrent is amplified by roughly two orders of magnitude, as a result, the output optical power from the hybrid device is greater than the input optical power. The operation of optical amplification together with wavelength conversion from infrared light to visible light is therefore achieved.

Figure 2:
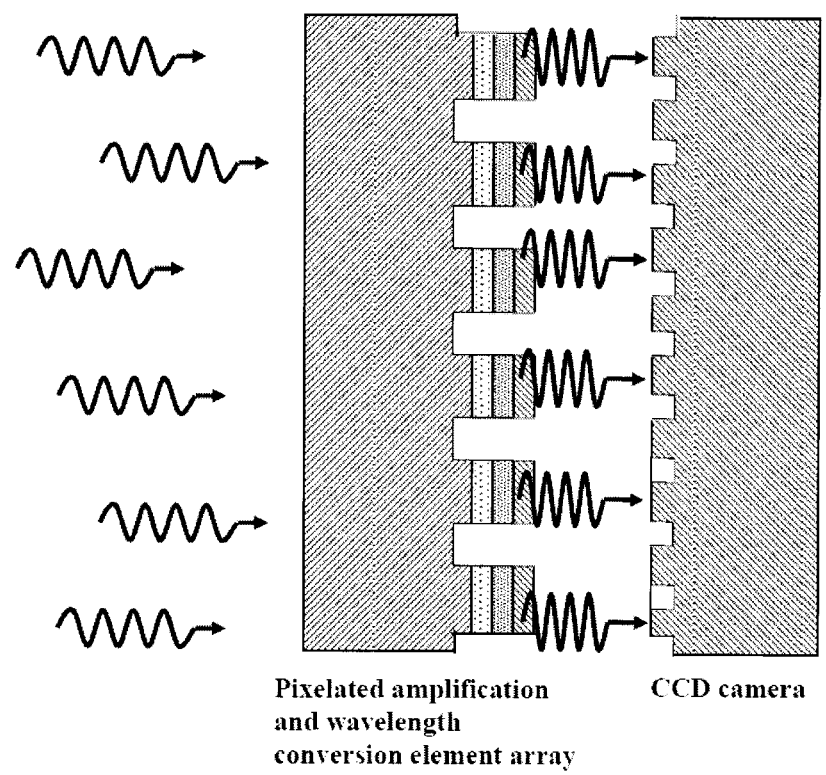
FIG. 2 is a representative cross-section (not to scale) of an optical amplifier array of the present invention, in this case with wavelength conversion for infrared imaging application juxtaposed an array of Si charge coupled devices (CCDs) elements.

FIG. 2 is a cross-section of a hetero-junction phototransistor (HPT), an embedded mirror, and an OLED integrated on a substrate and subdivided into an array of working units. Each working unit may form a mesa structure and consists of a sub-HPT, a sub-embedded mirror and a sub-OLED. All working units may be connected in parallel and biased at a constant voltage. A Si CCD, for example, formed in a plane is placed with its detecting surface in close proximity to the sub-OLEDs array. In operation, the incoming IR energy passes through the substrate and is detected by each sub-HPT. The resulting photocurrents are injected through the sub-embedded-mirror electrodes and drive the corresponding sub-OLEDs to emit visible light. The outgoing amplified optical energy is detected by a Si CCD camera and is subsequently processed for display in a well know manner. Due to the close proximity of the Si CCD to the HPT-embedded mirror-OLED array wafer, the wafer may also act as an optical filter, blocking back-ground light energy from reaching the CCD camera.

Figure 3:
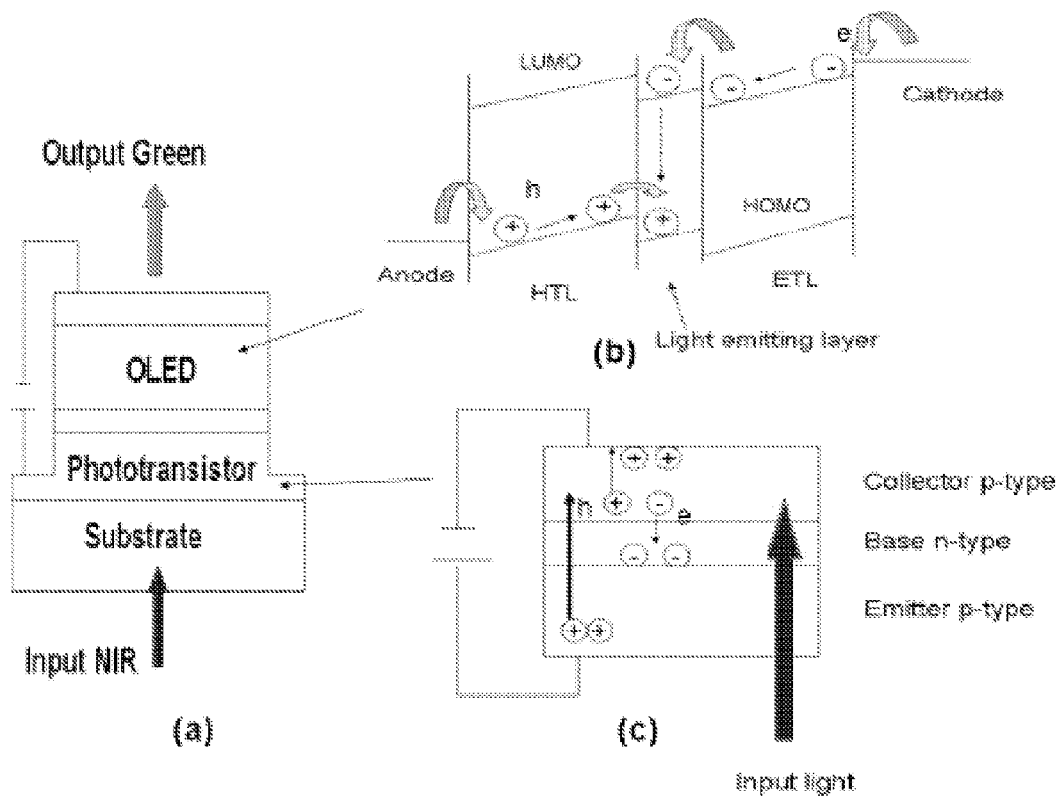
FIG. 3(a) is a schematic diagram of a hybrid up-conversion device in accordance with the present invention.
FIG. 3(b) is an energy diagram of an OLED.
FIG. 3(c) is a schematic diagram of a p-n-p HPT structure (forward-bias emitter-base junction and reverse-bias collector-base junction).

FIGS. 3(*a*), 3(*b*), and 3(*c*) show aspects of a hybrid up-conversion device, based on the present invention. Incoming 1.5 μM light is absorbed by the HPT component. The generated photo-carriers are amplified in the HPT and then injected into the OLED to emit visible light (green), depending on different organic emissive materials used, shown in FIG. 3(*a*). In this hybrid device, the p-doped collector of the HPT functions as the anode of the OLED. As there is no intrinsic charge carrier in the organic molecules, charge carriers are injected from the cathode and the anode, as shown in FIG. 3(*b*). The injection of holes from the collector is modulated by incoming 1.5 μm light. The layer structures and doping profiles of the HPT component may be designed to improve the electrical gain. With the incorporation of sufficient internal gain, the intensity of output visible light is greater than that of the input NIR light.

The present invention provides the first compact device that functions not only as a NIR wavelength up-converter, but also as an optical power amplifier. An HPT is basically a heterojunction bipolar transistor with a light sensitive collector and base region. FIG. 3(*c*) shows the schematic diagram of the mentioned p-n-p InGaAs/InP HPT, including a forward-bias emitter-base junction and reverse-bias collector-base junction. 1.5 μm light is absorbed in the narrow bandgap collector and base region, producing electron-hole pairs. Subsequently, holes drift toward the collector while electrons drift toward the floating-base region due to a built-in junction field. Electrons accumulate in the base and these extra charges forward bias the base-emitter junction, causing more holes to be injected from the p-InP emitter. Some of the injected holes may be lost in the base due to the recombination with electrons but most of the injected holes diffuse across the thin base layer and reach the base-collector depletion region, leading to an optical gain.

Implementation of the Optical Amplifier Design

Figure 4:
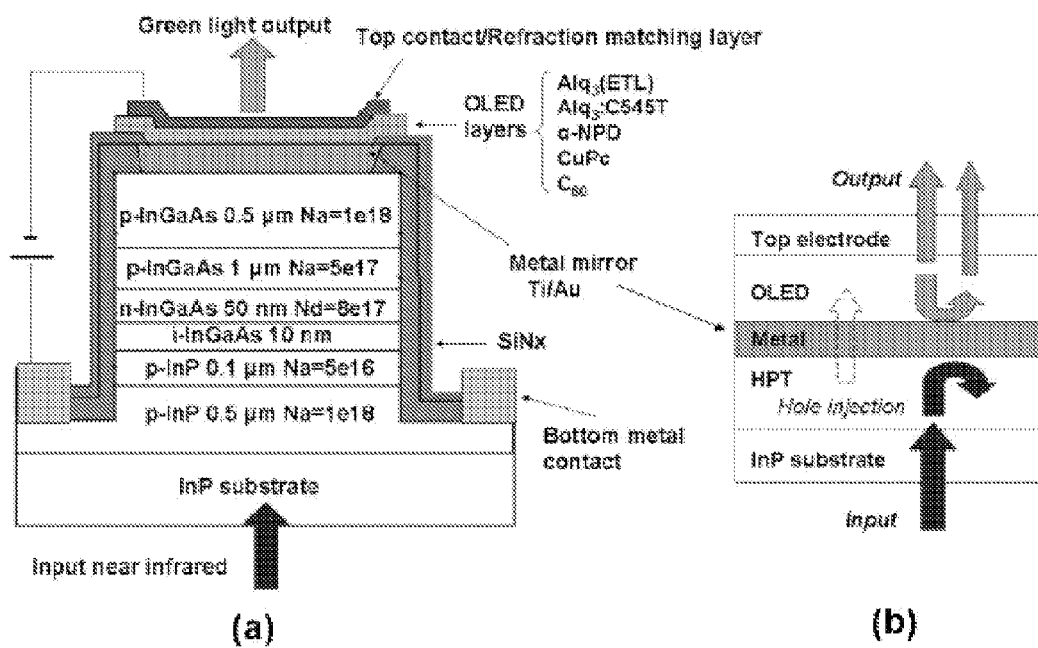
FIG. 4(a) is a schematic cross-section of a hybrid optical up-converter device of the present invention, with integrated InGaAs/InP HPT and an OLED. Note that the thickness of the organic and inorganic layers is not to scale.
FIG. 4(b) shows that insertion of a highly reflective metal layer as an embedded optical mirror can improve the absorption and emission efficiency.

FIG. 4(*a*) shows further details of a possible layer structure for the organic/inorganic hybrid optical amplifier of the present invention. The reflector or embedded mirror mentioned above may be implemented as a metal mirror (Ti/Au) embedded between the HPT and the OLED to form a good contact and also to enhance input light absorption efficiency as well as output light emission efficiency. The embedded mirror layer may consist of 20-nm Ti and 100-nm Au. The hole injection layer (HIL) of the OLED may be for example a 3-nm thick layer of fullerene (C$_{60}$). The hole transport layers (HTLs) consists of copper phthalocyanine (CuPc) (25 nm) and N,N'-diphenyl-N,N'-bis-(1-naphthyl)-1-1'-biphenyl-4,4'-diamine (α-NPD) (45 nm). The 30 nm thick emission zone may be tris-(8-hydroxyquinoline) aluminum (Alq$_3$), doped with 1 wt. % 10-(2-benzothiazoly)-1,1,7,7-tetramethyl-2,3,6,7-tetrahydro-1H, 5H, 11H-[1]benzo-pyrano[6,7,8-ij]quino-lizin-11-one (C545T). The electron transport layer (ETL) may be made of an additional 15 nm thick Alq$_3$ layer. The top metal contact may consist of LiF (1 nm)/Al (5 nm)/Ag (15 nm). Finally a 45-nm thick Alq$_3$ layer is refractive-index matching layer. As shown in FIG. 4(*b*), the spontaneous emission from the OLED is random in radiative direction. With a high-reflectivity metal layer underneath the OLED, the photons that are originally emitted downward will be bounced back at the OLED/metal interface. After changing directions, this portion of the photons can contribute to the top emission of the device thus enhancing the OLED efficiency. The absorption efficiency of the HPT side may also be enhanced in a similar way with the insertion of such a metal layer.

Performance of Optical Amplifier in Certain Embodiments

Figure 5:
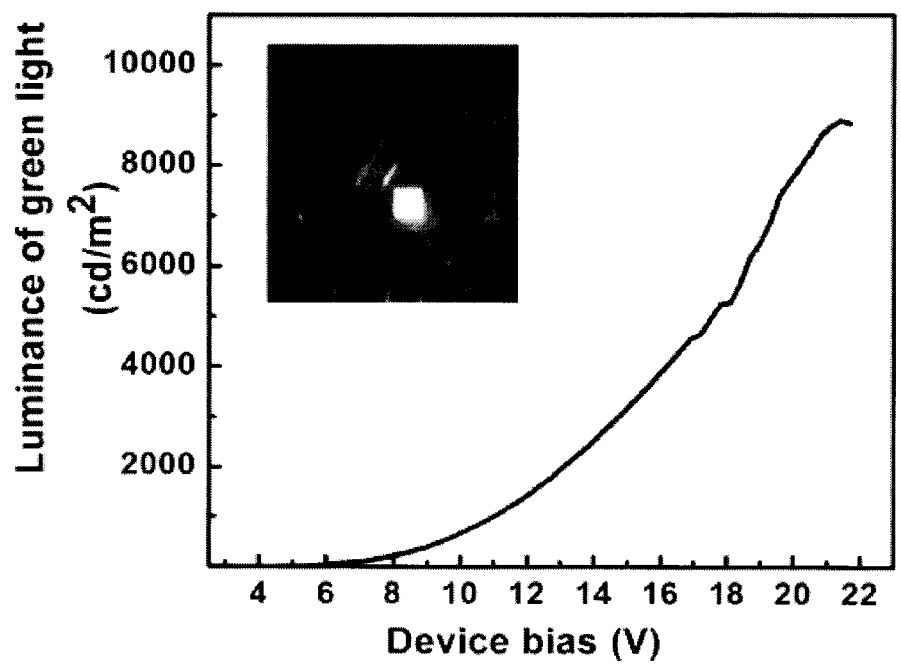
FIG. 5 shows the luminance-voltage (L-V) curve of an up-converter based on the present invention, under 1.5-μm infrared illumination, with NIR power density of 1.2 mW/cm² [inset: image of hybrid upconverter operating at 15 V with input NIR from bottom].

FIG. 5 shows the luminance-voltage (L-V) curve of this up-conversion device, implementing the present invention, under 1.5 μm infrared illumination with a power density of 1.2 mW/cm$^2$. Incoming 1.5 μm optical radiation is absorbed by the HPT, generating an amplified photocurrent. The resultant photocurrent drives the OLED that emits green light. The integrated device may start to turn on at a low bias (~6 V). This shows that efficient hole injection from the semiconductor to the organic layers is achieved via the floating metal contact, also implemented by the embedded mirror in this implementation of the invention. The inset of FIG. 5 is the image of a hybrid up-converter operating at 15 V with input NIR from bottom. As the device bias continues to increase, the output luminance of the green emission may increase rapidly up to 9000 cd/m$^2$. The rapid increase of the luminance is mainly due to the increase of the photo-carrier collection efficiency and internal electrical gain, which is enhanced by the additional external voltage that dropped across the HPT component.

Figure 6:
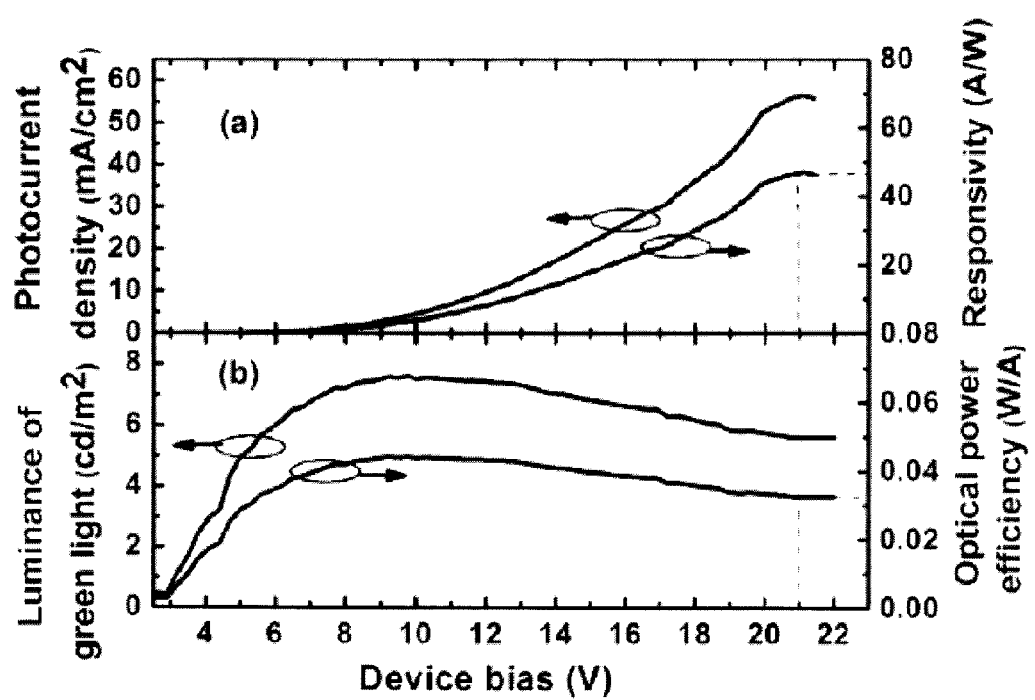
FIG. 6(a) shows measured photocurrent density (mA/cm²) as a function of device bias under 1.5-μm infrared radiation of 1.2 mW/cm² and the calculated responsivity (A/W) of the HPT component.
FIG. 6(b) shows measured luminance efficiency (cd/A) of the OLED component of the integrated up-converter and the calculated optical power efficiency (W/A). The power consumption of the integrated up-converter is 17.2 mW at 21 V bias with a total current of 0.82 mA.

FIG. 6 (a) shows the measured photocurrent density (total current density minus dark current density) as a function of device bias under 1.5 μm infrared radiation (1.2 mW/cm$^2$), together with the calculated responsivity of the HPT component, in a particular example of the implementation of the invention. The responsivity starts to rise at 6 V and gradually increases with further increase of the device bias. At 21 V bias (the total voltage dropped across the HPT component and the OLED component), the responsivity is measured to be 47 A/W under input infrared radiation of 1.2 mW/cm$^2$. In comparison, the responsivity of an InGaAs/InP p-i-n PD with similar absorbing layer thickness is around 0.5 A/W at a bias of ~1-2 V. The electrical gain of the HPT component of the hybrid up-converter is therefore estimated to be 94. FIG. 4(b) shows the measured current efficiency of the OLED part of the hybrid up-converter. The luminance efficiency first increases with the device bias. At ~10 V, it reaches a maximum value of 7.6 cd/A, and then it decreases slowly with further increasing device bias. The luminance efficiency (cd/A) can be converted to OLED external power conversion efficiency (W/A) by assuming that the up-converter device is a Lambertian source and using 540 lm/W as the power conversion constant. The calculated optical power efficiency is also plotted in FIG. 6(b) with a value of 0.033 W/A under 21 V bias. The overall external up-conversion efficiency can then be calculated by multiplying the detector responsivity (A/W) and the OLED optical power efficiency (W/A), so the calculated value is 1.55 W/W at a bias of 21 V, which means the power of the output green light is 1.55 times of the input infrared light. The device therefore exhibits optical amplification with wavelength conversion from infrared light to visible light.

Figure 7:
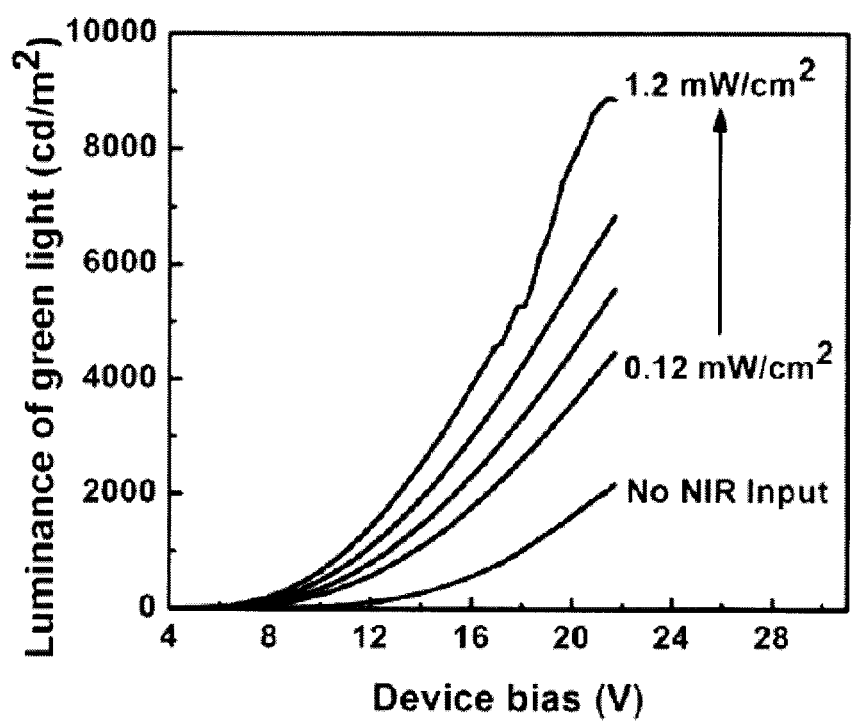
FIG. 7 NIR-induced green light luminance as a function of device bias under different NIR illumination conditions (0.12 mW/cm², 0.3 mW/cm², 0.6 mW/cm², 1.2 mW/cm²).

FIG. 7. demonstrates, in a particular implementation of the present invention, optical amplification and NIR-to-visible light up-conversion operation, and the intensity of the output OLED emission is measured with different input NIR power densities. The results of optical amplification and wavelength conversion are plotted in FIG. 7. Under dark condition (i.e., no input NIR illumination), the luminance of the green light emission from OLED is very low below a bias of 12 V. It increases above 12 V due to the amplified dark current by the HPT component. Possible origins of the dark current are structural defects from wafer growth and interface states formed at the integration of the HPT with the OLED, which needs to be clarified and suppressed for further improvement in device performance. With NIR illumination, the output luminance of the device becomes evident at a bias of ~9 V. As the NIR input power density increases from 0.12 to 1.2 mW/cm$^2$, the values of the output luminance at 21 V increased from ~4100 to 9000 cd/m$^2$, clearly demonstrating the up-conversion operation of the hybrid device at room temperature.

FIGS. 8(a), 8(b) and 8(c) shows a schematic diagram of three configurations of p-n-p InGaAs/InP HPT (structure 1, structure 2 and structure 3) and their simulated I-V curves under different NIR illumination conditions. These configurations illustrate possible designs for the device of the present invention, in order to achieve the performance characteristics described. A person skilled in the art will realize that other designs/configurations are possible.

In the specific embodiments of the invention illustrated in FIGS. 8(a), 8(b) and 8(c), the following strategies were employed in order to achieve a sufficient built-in gain in the HPT component: (i) reducing the base layer thickness to an operable thickness of around 50 nm, or alternatively between around 20 nm to 200 nm, and (ii) hole injection efficiency was enhanced from the emitter. A bi-layer emitter structure with high-low doping profiles for example may be used in order to suppress recombination current at the interface of the emitter/base and thereby substantially improving hole injection efficiency is substantially improved.

Figure 8:
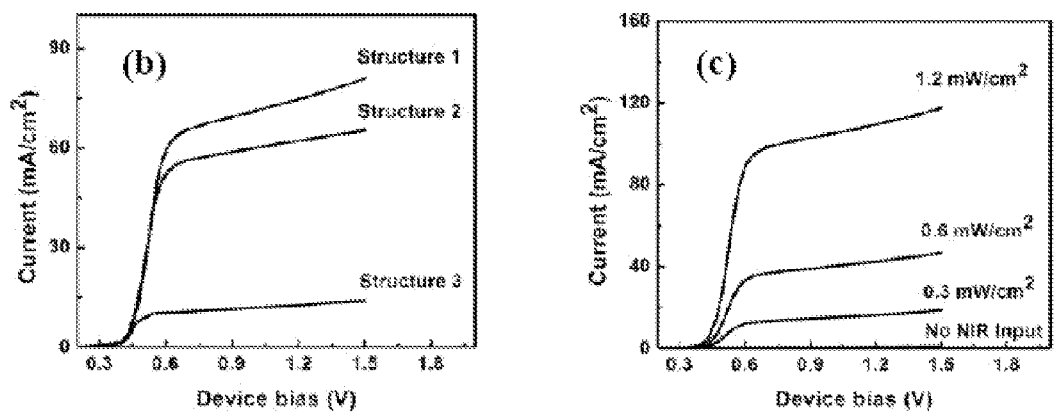
FIG. 8(a) is a schematic diagram of the three configurations of p-n-p InGaAs/InP HPT (structure 1, structure 2 and structure 3)
FIG. 8(b) shows simulated I-V relationships for three HPT structures under NIR illumination of 1.2 mW/cm².
FIG. 8(c) shows simulated I-V relationships of HPT (structure 1) under different NIR illumination conditions (1.2 mW/cm², 0.6 mW/cm², 0.3 mW/cm² and no NIR).

A device simulation study was carried out using SimWindows™, a drift-diffusion simulator. Three structures were designed and simulated for optimizing the device performance, as shown in FIG. 8 (a). In structure 1, the thickness of the base layer is 50 nm and the emitter is formed by high-low doping double layers, which are expected to reduce the recombination current (leakage current). Structure 2 has a thicker base (100 nm), but with the same high-low doping double emitter layers as structure 1 for studying the effect of base thickness. Structure 3 has a higher doping profile in the second emitter layer and the thickness of the base layer is 100 nm. The other parameters are the same. FIG. 8(b) shows the simulated current-voltage (1-V) characteristics of the three structures under 1.2 mW/cm$^2$ infrared illumination. At 1 V bias, the responsivities were 59 A/W, 50 A/W and 10 A/W for structure 1, structure 2 and structure 3, respectively. Comparing structure 1 and structure 2, the improved device performance may be attributed to the reduced thickness of the base layer. By the formation of a high-low composition abrupt junction in emitter layers, structure 2 exhibits more than 3 times improvement over structure 3. The high-low double emitter layers could reduce the recombination current at the interface of the emitter/base to improve the optical gain of the HPT significantly. Simulated I-V characteristics of structure 1, under different input optical illumination conditions are shown in FIG. 8(c). For bias below 0.6 V, device current increased rapidly with bias. After that, device current increased slowly with bias and the saturation current was controlled by the input optical power. Based on the simulated results, structure 1 is chosen as the optimized HPT.

Figure 9:
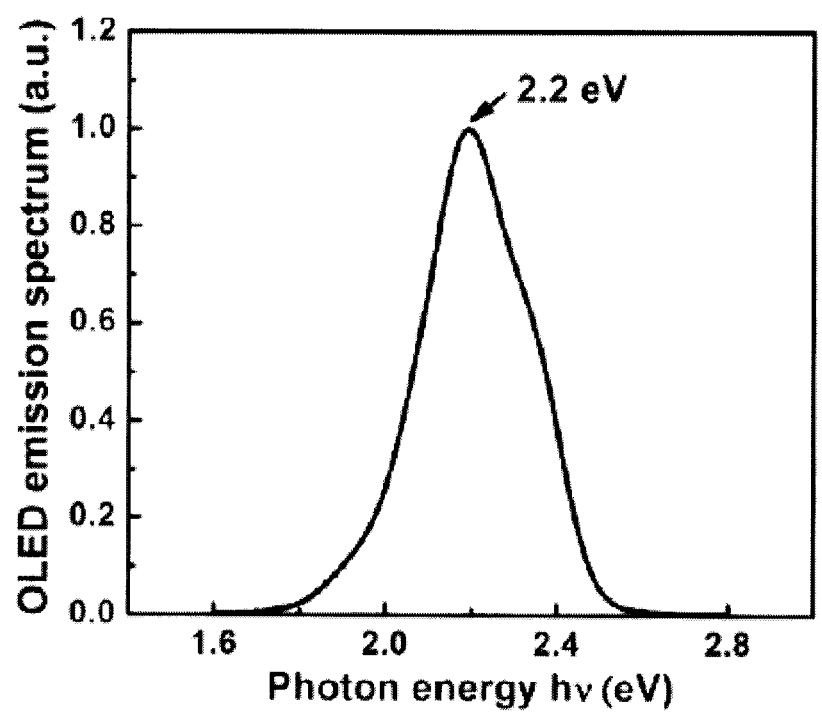
FIG. 9 shows the OLED emission spectrum of the integrated up-converter in accordance with the present invention, which is peaked at 2.2 eV (the corresponding wavelength is 564 nm).

FIG. 9. shows the OLED emission spectrum of an integrated up-converter, in accordance with the present invention, which is peaked at 2.2 eV (the corresponding wavelength is 564 nm). The spectrum covers a wide range from 1.6 eV to 2.8 eV in photon energy. The averaged output photon energy may be calculated by weighting the photon energy with the relative intensity of the emission spectrum, as shown below $$\overline{hv_{output}} = \frac{\int_{1.6\ eV}^{2.8\ eV} hv \cdot \text{Spectrum\_Intensity} \cdot d(hv)}{\int_{1.6\ eV}^{2.8\ eV} \text{Spectrum\_Intensity} \cdot d(hv)} = 2.18\ eV$$

Details of Possible Fabrication Process

A first step of a representative fabrication process to make a device in accordance with the present design consists of patterning and etching square mesas (1×1 mm$^2$) onto the p-InP emitter. Square mesas may be patterned using standard photolithography. A solution of $H_2SO_4$:$H_2O_2$:$H_2O$ (1:8:160) may be used to etch the InGaAs layer (~1.6 μm thick) and another solution of $H_3PO_4$:HCl (10:1) may be used to etch part of the p-InP layers (~0.2 μm thick) to complete the square mesas. A 150-nm $Si_3N_4$ layer (SiN) may then be grown on the top surface of the InGaAs/InP sample using plasma-enhanced chemical vapour deposition (PECVD). The SiN outside of the square mesa may be etched off to form an open area, where a metal layer (Ti/Au) may be deposited to serve as a common bottom contact. Square windows with a size of 0.9×0.9 mm$^2$ may be patterned using photolithography on top of the square mesas and chemically etched onto the SiN layer. The etching may be applied through the entire SiN insulation layer to expose the semiconductor square mesa areas, on top of which an embedded metal mirror (Ti 20 nm/Au 100 nm) may be deposited using electron-beam evaporation. A second SiN layer may be deposited to bury the metal mirror and may be later partially etched off to expose a smaller window (0.8×0.8 mm$^2$) right on the top of the metal mirror. The second SiN layer may be mainly for minimizing potential leakage current, which could significantly degrade device performance.

The InGaAs/InP substrate may then be ultrasonically cleaned with a regiment of chloroform, acetone and methanol followed by ultraviolet (UV) ozone treatment for 30 minutes. Thereafter the sample may be loaded into a Kurt J. Lesker LUMINOS cluster tool for deposition of the OLED. The molecular films may be deposited sequentially through a shadow mask (15×15 mm$^2$ opening) over the entire top surface of the substrate. Semi-transparent cathode metal electrodes (1.2 mm in diameter) may deposited on the top of the square mesa structures using a second shadow mask, without breaking vacuum. The top cathode layer may be composed of LiF (1.0 nm)/Al (5.0 nm)/Ag (15 nm), which has an adequate sheet conductance, and may be partially transparent to green light. Finally a 45 nm thick $Alq_3$ layer may be deposited, which could provide a better index of refractive-index matching from the LiF/Al/Ag to air.

The above results demonstrate a solid-state organic/inorganic hybrid optical amplifier with wavelength conversion from infrared to visible light, which consists of a heterojunction phototransistor, an embedded mirror and an OLED. The optical signal is amplified by 1.55 times and near-infrared to visible light electro-optic up-conversion has been demonstrated. Efficient carrier injection from the inorganic HPT to the OLED is achieved by the insertion of an embedded mirror at the inorganic-organic interface. As mentioned earlier, a device in accordance with the design disclosed herein may be fabricated using for example MOCVD growth of the HPT and subsequent direct tandem integration. This structure can be scaled up into efficient and inexpensive pixelated devices with two-dimensional arrays for image amplification and/or wavelength conversion imaging applications.

Range of Performance

Detection wavelength range may be λ=1.1 μm to 1.65 μm based on the implementation details set out above, however, this could potentially could be extended to mid-infrared range 2-5 μm or even longer wavelengths. Also, emission wavelength range may be λ=520-545 nm based on the implementation details set out above, but potentially could be extended to the whole visible light range of 400-700 nm by carefully selecting organic emission layer.

Responsivity of the detection component of the integrated device may be R=47 A/W based on the implementation details set out above, but potentially could be enhanced to a few hundreds A/W by further optimizing the HPT structure and the device fabrication process.

Efficiency of the OLED part of the integrated device may be 7.6 cd/A based on the implementation details set out below, and potentially could be enhanced to over 100 cd/A or more by further optimizing the OLED structure and device fabrication process.

Up-conversion efficiency of the integrated device may be 1.55 W/W based on the implementation described above, and potentially could be enhanced to over 10 W/W or more by further optimizing the a overall design and device fabrication process.

Material Characteristics

The light detection component includes an $In_{0.53}Ga_{0.47}As$/InP in accordance with a particular aspect of the present invention. More generally, however, it should be understood that the light detection component may include any materials/structures which can effectively absorb near infrared light and effectively collect photon-generated carriers and amplify the photocurrent.

Other suitable materials for the optical reflector are set out below. Besides Au, it is possible to also use Ag, or Al, or Ti, or some combination of these metals, such as Ti/Au, etc.

The light emission component may consist of any OLED, which generally consists of a hole transport layer, a light emission layer, and an electron transport layer or any other structures that can effectively converting current injection to optical light output.

The optical reflector may consist of any material/structure that can effectively reflect light in the visible-light and infrared-light regions, and also provide effectively electrical connection between the light detection component and the light emission component.

Possible Applications

It should be understood that the device described in this disclosure may be adapted for use in a number of different applications. For example (a) active surveillance cameras, such as near-infrared night vision cameras this can be used for rescues during night time, military missions, fire equipment to see through smoke/flame, etc.; Also, the device of the present invention may be used in (b) infrared-inspection cameras, which may for example be used to inspect Si semiconductor wafers and integrated circuits. The infrared light can pass through the Si materials, as a result, the camera can find any defects that are buried underneath the top surface. Such cameras may also be used in solar cell modules. The device may also be used in infrared face recognition systems. For example a camera incorporating the technology of the present invention can work in a so-called eye-safe wavelength range (1.5 μm—invisible to human naked eyes), so the infrared face recognition system can safely capture human faces under any illumination conditions (daytime, night time, foggy, etc). The present invention may be also used in biomedical imaging systems, where 1.5 μm light can penetrate deeper into bio-tissues than visible light, as a result, this infrared camera can be used to capture images from underneath the tissue surface and can be used for biomedical imaging applications.

Similarly, other technologies may incorporate the device of the present invention, including quality monitoring systems, environmental monitoring systems, and so on.

It will be appreciated by those skilled in the art that other variations of the embodiments described herein may also be practiced without departing from the scope of the invention. Other modifications are therefore possible.

We claim:

1. A hybrid organic/inorganic optical amplifier device, characterized in that the device comprises:
    (a) a base layer coated with a contacting electrode connected to a circuit;
    (b) an inorganic photoconductive element, configured to provide built-in gain; and
    (c) an optical reflector on the photoconductive element, connected to an organic electroluminescent element,
    wherein the inorganic photoconductive element, the optical reflector, and the organic electroluminescent element are made and integrated so that (A) upon application of the inorganic photoconductive element, or exposure of the inorganic photoconductive element to, electromagnetic radiation, the inorganic photoconductive element generates carrier charges, and (B) based on application of a charge current to the base layer, a carrier injection is produced from the inorganic photoconductive element to the organic electroluminescent element, thereby converting light in an infrared wavelength region to light in a visible-light range.

2. The device of claim 1, characterized in that the inorganic photoconductive element is either a hetero-injunction phototransistor element or a photoconductive detector.

3. The device of claim 1, characterized in that the inorganic photoconductive element is an inorganic heterojunction phototransistor (HPT).

4. The device of claim 1, characterized in that the optical reflector is an embedded metal electrode mirror that is made to function both as an optical mirror and as a charge injection electrode.

5. The device of claim 1, characterized in that the organic electroluminescent element is an organic light emitting diode (OLED).

6. The device of claim 1, characterized in that it is capable of amplifying incoming light and producing a light emission with a power greater than that of the incoming signal.

7. The device of claim 6, characterized in that the device is further operable to detect an incoming infrared electromagnetic wave and to convert the wave to a visible light wave.

8. The device of claim 1, characterized in that the device is made to achieve dual functions of optical power amplification and photon energy up-conversion.

9. The device of claim 3, characterized in that the HPT consists of an InGaAs/InP based HPT structure.

10. The device of claim 1, characterized in that the device is further made and integrated to amplify the charge current.

11. The device of claim 1, characterized in that the device is made and integrated to both amplify the incoming optical power and convert the incoming optical signal from infrared to visible light.

12. The device of claim 9, characterized in that the HPT includes a p-n-p comprising $In_{0.53}Ga_{0.47}As/InP$ HPT, which can absorb infrared light with a wavelength up to 1.65 µm and can amplify the photocurrent by two orders of magnitude or more.

13. The device of claim 12, characterized in that the HPT consists of a p-doped collector, a n-doped base and a p-doped emitter.

14. The device of claim 13, characterized in that the p-doped emitter has a bi-layer structure with a high-low doping profile in order to reduce the dark current of the device and enhance device performance.

15. The device of claim 4, characterized in that the embedded metal electrode mirror is a conductive layer capable of functioning as a hole injection electrode for the organic electroluminescent element.

16. The device of claim 15, characterized in that the embedded metal electrode mirror comprises a plurality of metal layers consisting of Ti/Au and/or Ti/Pt/Au.

17. The device of claim 1, characterized in that the organic electroluminescent element consists of a stack of hole transport molecules, electroluminescent molecules, and electron transport molecules.

18. The device of claim 17, characterized in that the organic electroluminescent element has a hole transport layer (HTL), a configuration consisting of one layer of NPB (N,N'-di(naphthalene-1-yl)-N,N'-diphenyl-benzidine), one layer of CuPc (Copperphthalocyanine) and one layer of C60 (carbon fullerene).

19. An imaging device, characterized in that the device comprises:
    (a) an array of optical amplifiers, wherein each optical amplifier defines a hybrid organic/inorganic optical amplifier area, each optical amplifier including:
        (i) a base layer coated with a contacting electrode connected to a circuit;
        (ii) an inorganic photoconductive element, configured to provide built-in gain; and
        (iii) an optical reflector on the photoconductive element, connected to an organic electroluminescent element,
    wherein the inorganic photoconductive element, the optical mirror, and the organic electroluminescent element are made and integrated so that (A) upon application of the inorganic photoconductive element, or exposure of the inorganic photoconductive element to, electromagnetic radiation, the photoconductive element generates a carrier charge, and (B) based on application of a charge current to the base layer, a carrier injection is produced from the photoconductive element to the organic electroluminescent element, thereby converting light in an infrared wavelength region to light in a visible range.

20. An imaging device claimed in claim 19, characterized in that the array provides a high-efficiency, area for amplifying light signals in an infrared wavelength region.

* * * * *